United States Patent
Knanishu

[11] 3,993,951
[45] Nov. 23, 1976

[54] ALTERNATING CURRENT METER CIRCUIT

[75] Inventor: Sander Leman Knanishu, Tappan, N.Y.

[73] Assignee: RCA Corporation, New York, N.Y.

[22] Filed: Aug. 30, 1974

[21] Appl. No.: 501,981

Related U.S. Application Data

[63] Continuation of Ser. No. 331,590, Feb. 12, 1973, abandoned.

[52] U.S. Cl. ............................ 324/119; 324/123 C
[51] Int. Cl.² ..................... G01R 19/22; G01R 1/30
[58] Field of Search ............ 324/119, 123 R, 123 C

[56] References Cited
UNITED STATES PATENTS

| | | | |
|---|---|---|---|
| 3,746,984 | 7/1973 | Cerveny | 324/119 |
| 3,836,852 | 9/1974 | Ross | 324/123 R |

OTHER PUBLICATIONS

Sensitive DC-VTVM Type MV-27C; Millivac Inst. Corp., Schenectady, N.Y.; Nov. 8, 1956.
Electronics Buyers' Guide; p. 497; June 1958.
Sharpe, L. E.; "Wide-Band A.C. Millivoltmeter"; Electronics World; Jan. 1960; pp. 58, 59, 130.

Primary Examiner—R. V. Rolinec
Assistant Examiner—Ernest F. Karlsen
Attorney, Agent, or Firm—Edward J. Norton; William Squire

[57] ABSTRACT

An alternating current meter circuit includes a feedback network coupled between a high input impedance field-effect transistor amplifier circuit and a detection circuit providing high input impedance, gain stability, linearity and precision.

1 Claim, 1 Drawing Figure

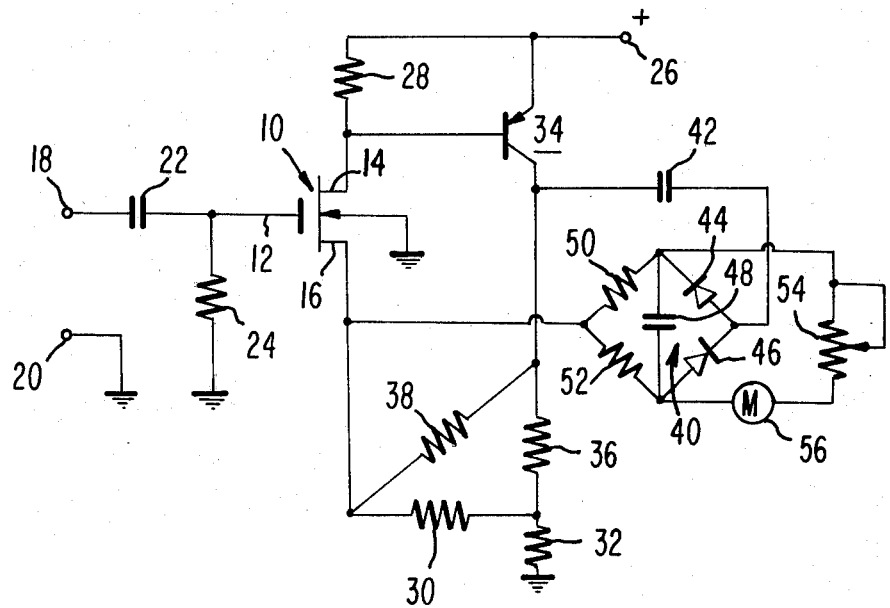

ALTERNATING CURRENT METER CIRCUIT

This is a continuation of application Ser. No. 331,590 filed Feb. 12, 1973, now abandoned.

BACKGROUND OF THE INVENTION

The present invention relates to alternating current circuits and particularly to amplifier circuits for use in alternating current meters. Alternating current amplifier circuits amplify an alternating signal for driving a meter used in measuring the amplitude of an alternating signal. These circuits usually comprise a number of transistor stages in addition to a high input impedance field-effect transistor (FET) for amplifying the alternating signal, detecting the amplified signal and then applying the detected direct current voltage to a D.C. meter calibrated to indicate the magnitude of the alternating current voltage represented by the magnitude of the meter direct current.

However meter amplifiers heretofore utilized including field-effect transistors and bipolar transistors have not been completely satisfactory with respect to operating stability in the presence of temperature and bias voltage fluctuations. In view of these fluctuations it is desirable that the amplified waveform follow the signal to be measured with significant precision. Additionally, it is desirable to provide such an amplifier with high gain. However, as well known, gain is reduced to obtain stability in a given circuit. To overcome this conflict, prior art circuits utilize a number of stages which increase the circuit complexity and cost. Additionally, it is desirable to provide a circuit that is linear and is competitive with respect to production costs. This latter requirement entails that a circuit be simple and have as few components as possible.

SUMMARY OF THE INVENTION

A field-effect transistor includes a gate and a channel region. Input terminal means coupled to the gate supply the gate with an alternating signal applied to the terminal means. Amplifier means are coupled to the channel region for amplifying the alternating signal. Detector means are coupled to the amplifier means for providing a direct current and voltage representative of the amplitude of the alternating signal. A portion of the amplified alternating signal at the amplifier means are fed to the channel region to stabilize the gain of the unipolar transistor and the amplifier means during the occurrence of temperature and biasing voltage fluctuations, and to compensate for nonlinearities in the detector means occurring during varying alternating current signal levels.

DESCRIPTION OF THE DRAWING

The sole drawing is a schematic diagram of an alternating current meter amplifier constructed in accordance with the present invention.

DETAILED DESCRIPTION

Apparatus constructed and operated in accordance with the present invention utilizes field effect transistors, and in particular, insulated-gate field-effect transistors (FET). An insulated gate field-effect transistor may generally be defined as a majority carrier field-effect device which includes a body of semiconductive material. A carrier conduction channel within the semiconductive body is bounded at one end thereof by a source region and at the other end thereof by a drain region. The gate or control electrode means overlies at least a portion of the carrier conduction channel and is separated therefrom by a region of insulating material. Due to the insulation between the gate electrode and the channel, the input impedance of the insulating gate field-effect transistor is very large, on the order of $10^{15}$ ohms or more, so that substantially no current flows in the gate electrode circuit. Thus, the insulated-gate field-effect transistor is a voltage controlled device. Signals or voltages applied to the gate electrode means control by the field-effect, the conductance of the channel.

Such transistors may be of either the enhancement type or the depletion type. The depletion type unit is of particular interest in the construction of the apparatus embodying the present invention. In a depletion type unit, the impedance of the conductance path is relatively low when the source and gate have the same voltage. A bias voltage, of the proper polarity, applied between the gate and source increases the impedance of the conduction path. In an enhancement type unit the impedance of the conduction channel is very high when the gate and source voltages have the same value. A bias voltage, of the proper polarity, applied between the gate and source decreases the impedance of the conduction channel.

An insulated-gate field-effect transistor may be either a P-type or an N-type unit depending upon the majority carriers involved in drain current conduction. A P-type unit is one in which the majority carriers are holes; whereas an N-type unit is one in which the majority carriers are electrons.

In the drawing, the field-effect transistor 10 is an N channel depletion type device having an insulated gate electrode 12, a drain electrode 14 and a source electrode 16. The drain to source resistance will increase as the gate potential is made negative with respect to the potential at the source electrode. As the potential at the gate approaches the potential at the source electrode, the resistance of the drain source path decreases and the current therethrough increases. That is, a forward gate voltage draws more charge carriers into the channel and thus increases the channel conductivity. Conversely, a reverse gate voltage, or decreasing voltage, is one which depletes the charge in the channel and thereby reduces the channel conductivity.

The presence of temperature fluctuations such as an increase of temperature at transistor 10 causes the drain to source resistance thereof to decrease. Unless otherwise provided for, the increase in temperature results in an increase in drain to source current. The rise in temperature makes the potential difference between the gate electrode and the source electrode of the transistor 10 appear to be rising unless compensation is provided, thus causing an error in the transfer of signals from the gate electrode 12 to the drain and source electrodes 14 and 16. Thus temperature fluctuations will cause instability in the field-effect transistor during the operation thereof. Similarly, voltage fluctuations due to variations in biasing voltages applied to the drain electrode will cause similar undesirable fluctuations of potential in this device causing errors in a similar manner as described above with respect to temperature. In a similar manner, an increase of temperature at a bipolar transistor causes the emitter-collector path resistance to go down, increasing the current therethrough, thus causing instability in a circuit utilizing this device without compensation.

In accordance with the present invention, a feedback network is provided for a unipolar FET transistor such that whenever the drain to source resistance decreases due to a temperature increase, or conversely, whenever the resistance between the drain and source electrodes increases in view of a temperature decrease, the potential at the source electrode is caused to move in the opposite direction by the feedback network, to be described later herein, providing negative feedback. At the same time this feedback network to be described is arranged to provide stability of gain and linearity to the circuit by interacting signals from the various portions of the circuit including a bipolar transistor in a cooperating manner.

In the drawing an alternating current signal is supplied by suitable means to the input terminals 18 and 20 and thence through a coupling capacitor 22 connected between terminal 18 and gate electrode 12. System ground is connected to terminal 20. A resistor 24 is connected at the capacitor 22 and gate electrode 12 junction to system ground to provide a high input impedance to transistor 10. Because of the high impedance provided by the insulated gate construction of transistor 10, there is relatively little current flowing from the gate electrode 12 to electrodes 14 and 16. Positive bias potential is applied to terminal 26 through resistor 28 to drain electrode 14. Source electrode 16 is connected to system ground through serially connected resistors 30 and 32. Resistor 32 is a relatively small resistance with respect to the value of the resistance 30.

Drain electrode 14 is connected to the base of a PNP bipolar transistor 34. The emitter of transistor 34 is connected to terminal 26 while the collector thereof is connected to resistor 32 through resistor 36. Across resistors 30 and 36 is connected resistor 38.

Resistors 30, 32, 36 and 38 provide a voltage dividing feedback network which provides stability of gain in view of temperature fluctuations in transistors 10 and 34 and voltage fluctuations at terminal 26. The resistors 36 and 32 provide the load resistance for transistor 34 to system ground. The value of resistor 36 is made substantially less than the serial combined values of resistors 30 and 38 so that the effective load impedance for transistor 34 is provided by resistors 32 and 36 rather than resistors 30 and 38. Resistors 30 and 38 provide a negative potential feedback to source electrode 16, as will be explained.

The collector of transistor 34 is connected to detecting network 40 by way of coupling capacitor 42. Detecting network 40 includes two diodes 44 and 46. The anode of diode 44 is connected to the cathode of diode 46 and to capacitor 42. The cathode of diode 44 is connected to the anode of diode 46 through filtering capacitor 48. Across capacitor 48 are serially connected resistors 50 and 52. The junction of resistors 50 and 52 is connected to source electrode 16. Across capacitor 48 and the serial connection of diodes 44 and 46 is serially connected calibration adjustment variable resistor 54 and meter 56, which measures the voltage detected by circuit 40 and provides an indication of the measured voltage representative of the magnitude of the alternating signal applied to terminals 18 and 20. In the preferred embodiment field-effect transistor 10 may be a 3N128 type. Amplifying transistor 34 may be a 2N4403. When these transistors are used, values for the remaining circuit elements are as follows:

| | |
|---|---|
| C22 | 0.22MF |
| R24 | 1 Meg. |
| R28 | 1.5K |
| R30 | 1K |
| R32 | 10 |
| R36 | 2.2K |
| R38 | 10K |
| C42 | 25MF |
| C48 | 10MF |
| R50 | 6.8K |
| R52 | 6.8K |
| R54 | 0 – 20K variable |
| Voltage at terminal 26 – 12 to 18V | |

In the operation of the apparatus constructed and operated in accordance with the present invention, assume an alternating current signal whose magnitude is to be measured by meter 56 is applied to input terminals 18 and 20. The alternating current signal is amplified by transistors 10 and 34. The amplified signal is applied from the collector of transistor 34 through capacitor 42 to the detector circuit 40. The amplified alternating current signal is detected by diodes 44 and 46 and the rectified voltage provides a direct current through the meter 56 and resistor 54. The magnitude of this direct current is a measure of the magnitude of the amplitude of the alternating signal applied to terminals 18 and 20.

The ratio of the magnitude of resistor 38 to the magnitude of resistor 30 determines the gain of the amplifier. In the preferred embodiment, the value of resistors 30 is 1/10th the value of resistor 38, and thus, the potential at source electrode 16 will be 1/11th of the potential drop across resistor 36. Additionally, the value of resistor 38 is set sufficiently high to isolate the source electrode 16 from the collector output electrode of transistor 34. The potential at source electrode 16, provided by voltage dividing resistors 30 and 38 across resistor 36, provides a negative feedback potential at source electrode 16.

In the network including transistor 10 and resistors 28, 30 and 32, assume, for example, that an ambient temperature fluctuation results in an increasing temperature at transistor 10. This increase in temperature decreases the drain to source resistance of transistor 10 increasing the drain to source current therethrough. This increasing current causes the potential at the source with respect to system ground to increase due to the presence of resistors 30 and 32. With the bias potential on the gate 12 held constant the rise in potential at the source electrode tends to decrease the gate to source potential thereby stabilizing the drain to source current despite the rise in temperature.

This decreasing potential difference causes the drain to source resistance to increase. This causes a decrease in current through the drain to source path, which then results in a decrease in the source potential with respect to ground thus stabilizing the drain to source current. It can also be shown that in the presence of decreasing temperature with negative feedback provided by the resistance network of resistors 30, 32, 36 and 38, the potential at the source tends to decrease thereby counteracting the effect of the decreasing temperature. Negative feedback is also present in the network including transistors 10 and 34 and resistors 28, 30, 32, 36 and 38. Assume the gate potential goes up, the source potential goes up with respect to system ground and the drain potential goes down with respect to the source. With the drain potential decreasing, transistor collector 34 potential increases. The potential at the source electrode through resistor 38 with respect to the gate increases making the gate more negative with respect to the source and thus making the potential at the gate appear to move in a direction opposite to the applied signal direction.

The greater the value of resistor 38, the lower the feedback and the greater the gain. Therefore, by providing a high value resistor 38 such as 10K, relatively high gain is provided. However, the presence of resistor 38 decreases the maximum gain otherwise provided in the absence of feedback, providing a compromise between a maximum and minimum gain. This feedback, while being less than the maximum provided by a feedback with zero impedance is sufficient to provide substantial gain to the amplifier at the same time providing negative feedback by way of the voltage dividing effect of the resistance network comprising resistors 30, 32, 36 and 38 as explained above.

With the source potential increasing and decreasing in the same direction as a potential at the collector of transistor 34, negative feedback is provided in the sense that any increase in the source potential tends to decrease relatively the gate potential which in turn tends to cause the source potential to decrease. It should now be clear that transistor 10 alone, and in combination with transistor 34 is provided negative feedback which tends to stabilize the circuit through transistors 10 and 34 in the presence of temperature fluctuations. Additionally, voltage fluctuations due to variations in the source of potential applied to terminal 26, also tend to be stabilized in the same manner as described above with respect to temperature fluctuations.

Since the impedance of resistor 38 is valued relatively high with respect to the impedance of resistor 36, series resistors 36 and 32 provide the effective load resistance for transistor 34. This load resistance has a value providing relatively high dynamic range for the operating characteristics of transistor 34. Thus, if for example, resistor 36 were omitted, the dymamic range of transistor 34 would be severely limited should resistors 38 and 30 provide the effective load impedance for transistor 34.

A positive going signal, when applied to the gate electrode 12 produces a negative going signal at the base of transistor 34. This negative going signal provides a positive going signal at the collector of transistor 34 which results in the negative feedback described above. This positive going signal is detected by detector circuitry 40. This detected signal is fed back by way of resistors 50 and 52 to source 16. Since the detected signal was positive going, the feedback signal is also positive going and cooperates with the positive going signal applied to the gate and further provides additional negative feedback. Any positive increase in the source potential due to the feedback tends to make the gate electrode appear to be more negative with respect to system ground since relatively little current flows from the gate electrode to system ground due to resistor 24. The source potential then increases making the gate potential appear to be decreasing thus providing stability of gain.

In contradistinction, when the gate is negative going, the base potential of transistor 34 increases and the collector potential decreases. This collector potential again goes in the same direction as the potential at the source. The detected signal therefore also goes down making the source potential decrease. The collector and detector feedback potential going negative makes the source potential go negative with respect to the gate and therefore makes the gate appear to go positive with respect to the source, providing negative feedback. As a result, an alternating signal such as a sine wave amplified by transistors 10 and 34 follows closely and accurately the wave applied to terminals 18 and 20.

With respect to detector circuit 40, the magnitudes of resistors 50 and 52 are chosen to provide the desired loading for the detector. The alternating current is thus supplied through resistors 50 and 52 to source electrode 16 applying negative feedback to the transistor 10 at source electrode 16. Resistor 54, a conventional potentiometer, or the like, is provided to calibrate the meter 56. The feedback signal provided source electrode 16 through resistors 50 and 52, compensates for non-linearities in diodes 44 and 46. That is, below 0.2 volt, the diodes do not conduct. When the diodes start conducting at a potential greater than two tenths of a volt, a relatively large deflection appears on the meter. Therefore the lower scale divisions on the meter will be compressed and nonlinear. To linearize the meter scale, the signal fed back to the source electrode 16 from detector circuit 40 provides high gain at the low scale end of the meter due to the fact that the diodes are not conducting and there is minimal feedback. When the diodes conduct, the meter is pointing at the higher scale, feedback is provided and the gain of the circuit is reduced. Thus, compensation is provided throughout the operating range of detector 40. It is to be understood that the field-effect transistor 10 is selected to have bias characteristics which are constant in a given range of Idss variation (gate to source shorted drain to source current) and that the $G_m$ of the FET is within the input signal voltage dynamic range.

Thus, there has been provided in accordance with the present invention, an apparatus which has stability of gain, linearity, and precision of amplification provided by a feedback resistive network which, while providing an increased gain, does not increase correspondingly the load resistance of the amplifier transistor, providing a wide operating dynamic range of the amplifier bipolar transistor. The resistor feedback network provides linear feedback for the field-effect transistor for the combination of the field-effect transistor and the bipolar transistor and for a detector having nonlinear characteristics. Additionally, a high input impedance is provided this amplifier circuit to permit suitable measurement in a variety of test circuits. These aims are accomplished with a minimum number of components and a simple circuit arrangement.

What is claimed is:
1. An alternating current meter circuit comprising:
 a field-effect transistor having a gate and a channel region,
 input terminal means coupled to said gate for supplying said gate with an alternating signal,
 amplifier means coupled to said channel region for amplifying the alternating signal at the channel region of said field-effect transistor,
 detector means including a coupling capacitor connected between said amplifier means and said channel region, said amplifier means comprising a bipolar transistor having a control electrode connected to said channel region and an output elec- trode coupled by said capacitor to said detector means, and resistance dividing means connected between said transistor output electrode and said channel region across said detector means and arranged to provide negative feedback to said field-effect transistor to stabilize said field-effect transistor and amplifier means, said dividing means including first and second resistance means serially connected between said output electrode and said input terminal means, a third resistance means connected between said output electrode and said channel region, and a fourth resistance means connected between said channel region and the junction between said first and second resistance means, said third resistance means having a value tending to isolate said channel region from said output electrode, said first and second resistance means having a value less than said third resistance value to form the load resistance for said bipolar transistor, the ratio of said third and fourth resistance means having a value tending to stabilize the output of said amplifier means, the value of said second and fourth resistance means having a value tending to stabilize said field-effect transistor, said detector means and said dividing means providing a separate, different signal fed back from said amplifier means output electrode to said channel region.

* * * * *